United States Patent
Chowdhury et al.

(10) Patent No.: US 11,476,655 B2
(45) Date of Patent: Oct. 18, 2022

(54) TRAPPED CHARGE ESTIMATION

(71) Applicant: Schweitzer Engineering Laboratories, Inc., Pullman, WA (US)

(72) Inventors: Ritwik Chowdhury, Charlotte, NC (US); Gabriel Benmouyal, Boucherville (CA); Carolyn Sun, Charlotte, NC (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 422 days.

(21) Appl. No.: 16/742,039

(22) Filed: Jan. 14, 2020

(65) Prior Publication Data

US 2021/0218239 A1 Jul. 15, 2021

(51) Int. Cl.
| | |
|---|---|
| H02H 1/00 | (2006.01) |
| H02J 3/04 | (2006.01) |
| H02J 13/00 | (2006.01) |
| H02H 3/00 | (2006.01) |
| G01R 19/00 | (2006.01) |
| G01R 31/58 | (2020.01) |
| G01R 29/24 | (2006.01) |
| G05B 19/042 | (2006.01) |

(52) U.S. Cl.
CPC ....... *H02H 1/0007* (2013.01); *G01R 19/0084* (2013.01); *G01R 29/24* (2013.01); *G01R 31/58* (2020.01); *G05B 19/042* (2013.01); *H02H 1/0092* (2013.01); *H02H 3/00* (2013.01); *H02J 3/04* (2013.01); *H02J 13/00002* (2020.01); *G05B 2219/2639* (2013.01)

(58) Field of Classification Search
CPC ...... H02H 1/0007; H02H 1/0092; H02H 3/00; H02H 3/06; G01R 19/0084; G01R 29/24; G01R 31/58; G05B 19/042; G05B 2219/2639; H02J 3/04; H02J 13/00002; H02J 13/00017; H02J 3/001; H02J 3/24; H02J 13/0004; Y02B 90/20; Y02E 60/00; Y04S 10/18; Y04S 10/30; Y04S 20/00
See application file for complete search history.

(56) References Cited

U.S. PATENT DOCUMENTS

| | | |
|---|---|---|
| 2,209,810 A | 7/1940 | Cordray |
| 3,401,304 A | 9/1968 | Woodworth |
| 3,546,534 A | 12/1970 | Kotos |
| 3,558,984 A | 1/1971 | Smith |
| 4,322,768 A | 3/1982 | Maeda |
| 4,757,263 A | 7/1988 | Cummings |
| 4,914,382 A | 4/1990 | Douville |
| 5,367,426 A | 11/1994 | Schweitzer, III |
| 5,418,776 A | 5/1995 | Purkey |
| 5,430,599 A | 7/1995 | Charpentier |
| 5,627,415 A | 5/1997 | Charpentier |

(Continued)

*Primary Examiner* — Akm Zakaria
(74) *Attorney, Agent, or Firm* — Bradley W. Schield; Richard M. Edge

(57) ABSTRACT

Systems and methods to estimate trapped charge for a controlled automatic reclose are described herein. For example, an intelligent electronic device (IED) may calculate an analog amount of trapped charge of each phase of a power line based on voltage measurements of the power line. The IED may close a switching device of each phase at a time corresponding to a point-on-wave associated with the analog amount of trapped charge of the respective phase.

19 Claims, 7 Drawing Sheets

(56) References Cited

U.S. PATENT DOCUMENTS

| | | | |
|---|---|---|---|
| 5,638,296 A * | 6/1997 | Johnson | H01H 11/0062 377/16 |
| 5,671,112 A | 9/1997 | Hu | |
| 5,703,745 A | 12/1997 | Roberts | |
| 5,805,395 A | 9/1998 | Hu | |
| 6,028,754 A | 2/2000 | Guzman | |
| 6,256,592 B1 | 7/2001 | Roberts | |
| 6,341,055 B1 | 1/2002 | Guzman-Casillas | |
| 6,356,421 B1 | 3/2002 | Guzman-Casillas | |
| 6,392,390 B1 * | 5/2002 | Ito | H01H 9/563 323/209 |
| 6,456,947 B1 | 9/2002 | Adamiak | |
| 6,518,767 B1 | 2/2003 | Roberts | |
| 6,571,182 B2 | 5/2003 | Adamiak | |
| 6,590,397 B2 | 7/2003 | Roberts | |
| 6,879,917 B2 | 4/2005 | Turner | |
| 6,919,717 B2 | 7/2005 | Ghassemi | |
| 7,345,863 B2 | 3/2008 | Fischer | |
| 7,425,778 B2 | 9/2008 | Labuschagne | |
| 7,469,190 B2 | 12/2008 | Bickel | |
| 7,472,026 B2 | 12/2008 | Premerlani | |
| 7,812,615 B2 | 10/2010 | Gajic | |
| 8,289,668 B2 | 10/2012 | Kasztenny | |
| 8,553,379 B2 | 10/2013 | Kasztenny | |
| 9,008,982 B2 | 4/2015 | Tziouvaras | |
| 9,263,213 B2 * | 2/2016 | Mori | H01H 9/563 |
| 9,870,879 B2 * | 1/2018 | Taillefer | H02J 3/24 |
| 2001/0012984 A1 | 8/2001 | Adamiak | |
| 2002/0101229 A1 | 8/2002 | Roberts | |
| 2007/0070565 A1 | 3/2007 | Benmouyal | |
| 2009/0059447 A1 | 3/2009 | Gajic | |
| 2009/0091867 A1 | 4/2009 | Guzman-Casillas | |
| 2010/0002348 A1 | 1/2010 | Donolo | |
| 2012/0306290 A1 * | 12/2012 | Fanget | H01H 33/593 307/140 |
| 2013/0054177 A1 * | 2/2013 | Montenegro | G01R 31/2648 702/108 |
| 2013/0234731 A1 * | 9/2013 | Tziouvaras | G01R 15/06 324/658 |
| 2017/0358404 A1 * | 12/2017 | Talluri | H03K 17/16 |

* cited by examiner

TRAPPED CHARGE ESTIMATION

TECHNICAL FIELD

The present disclosure relates generally to estimating trapped charge on a power line and, more particularly, to estimating the trapped charge for a controlled automatic reclose.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, and transformers, to provide electrical energy from sources to loads. Various intelligent electronic devices (IEDs) may be used in monitoring, control, and protection of the power delivery system. For example, IEDs may obtain voltage measurements and/or current measurements and send signals to circuit breakers to protect the electric power delivery system from exceeding designed operating conditions due to faults. While some faults are persistent and remain on the power line, other faults are transient and may be resolved with power being disconnected, by opening the circuit breaker for a period of time, and restored, by automatically closing the circuit breaker.

When the circuit breaker is opened, electric charge may be trapped on the power line (e.g., due to capacitance of the line). When the circuit breaker is subsequently closed to restore service, a voltage difference between the disconnected power line and the voltage of the remaining online power system may cause transients (e.g., traveling waves). These transients may exceed voltages that the power line was designed to withstand. Exceeding the designed operating conditions of the power system may affect equipment or cause faults that would otherwise clear as transient faults to become persistent faults.

As explained below, an IED may obtain voltage measurements of a power line when the power line is disconnected from a power system. The IED may determine an amount of trapped charge on the power line based on the voltage measurements. The IED may control operation of the circuit breaker based on the amount of trapped charge. Further, the amount of trapped charge may be an analog estimation. For instance, the trapped charge may be determined as various per-unit values limited by the precision of voltage measurements obtained by the IED By estimating the analog value of trapped charge on the power line, the IED may close the circuit breaker at a time that reduces the voltage differences between the disconnected power line and the remaining online power system.

Figure 1:
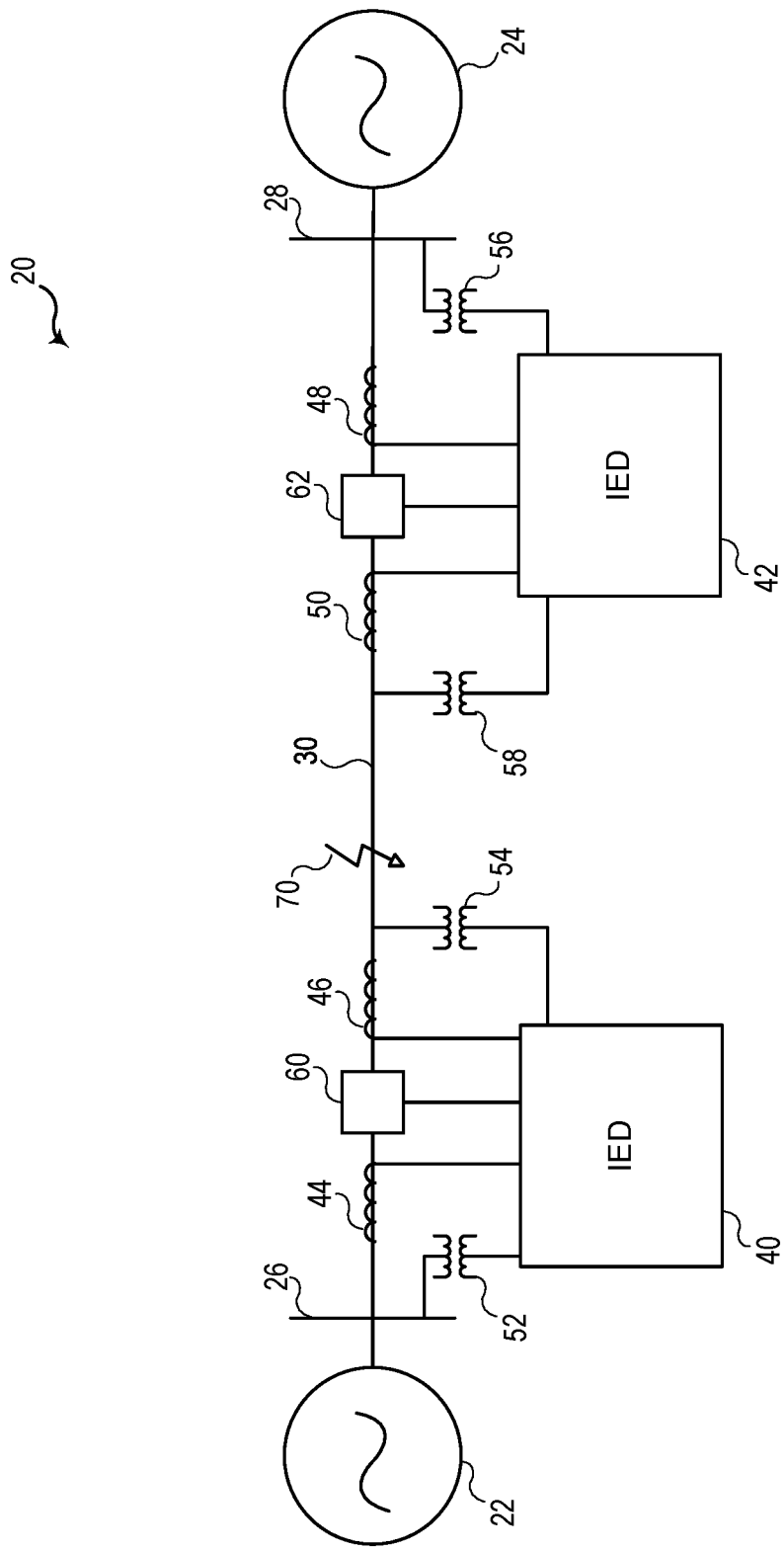
FIG. 1 is a one-line diagram of an electric power delivery system having an intelligent electronic device (IED) that determines the trapped charge of a power line, in accordance with an embodiment.

FIG. 1 is a one-line diagram of a power system 20 that includes power sources 22 and 24 that provide power to one or more loads. The power system 20 includes a power line 30, such as a transmission line, distribution line, or other power line, that connects a local terminal 26 and a remote terminal 28. The terminals 26 and 28 may be buses in a transmission system supplied by power sources 22 and 24. Although illustrated in single-line form for purposes of simplicity, power system 20 may be a multi-phase system, such as a three-phase electric power delivery system.

The power system 20 is monitored by a local IED 40 and a remote IED 42 located at the local terminal 26 and the remote terminal 28 respectively, although additional IEDs may also be utilized to monitor other locations of the system. As used herein, an IED (such as IEDs 40 and 42) may refer to any microprocessor-based device that monitors, controls, automates, and/or protects monitored equipment within the power system 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 40 and 42 may obtain electric power system information using current transformers (CTs) 44, 46, 48, and 50, and capacitor voltage transformers (CVTs) 52, 54, 56, and 58. The IEDs 40 and 42 may detect fault events on the power line 30 using current and voltage signals from the CTs 44, 46 48, and 50 and/or the CVTs 52, 54, 56, and 58. In some embodiments, the IEDs 40 and 42 may communicate power system data via a communication link between the IEDs 40 and 42.

When a fault 70 occurs on the power line 30, the IEDs 40 and 42 may detect, for example, an overcurrent on the power line via the CTs 44 and 46. The IEDs 40 and 42 may send a signal to the circuit breakers (CBs) 60 and 62 to trip the breakers, thereby disconnecting the power line 30 from the power sources 22 and 24. While an overcurrent is used as an example, other suitable conditions may be used to disconnect the power line 30.

The IEDs 40 and 42 may send signals to the CBs 60 and 62 to trip at different times. For example, the remote CB 62 may be disconnected before the local CB 60 due to a lower threshold overcurrent, a lower threshold current-over-time, a faster trip time, or detecting the overcurrent first. Upon disconnecting the remote CB 62, the power line 30 may remain energized by the power being delivered from the power source 22. Due to the fault 70, the IED 40 may then disconnect the CB 60. When the CB 60 is disconnected, charge may remain on the power line 30, referred to as trapped charge.

Figure 2:
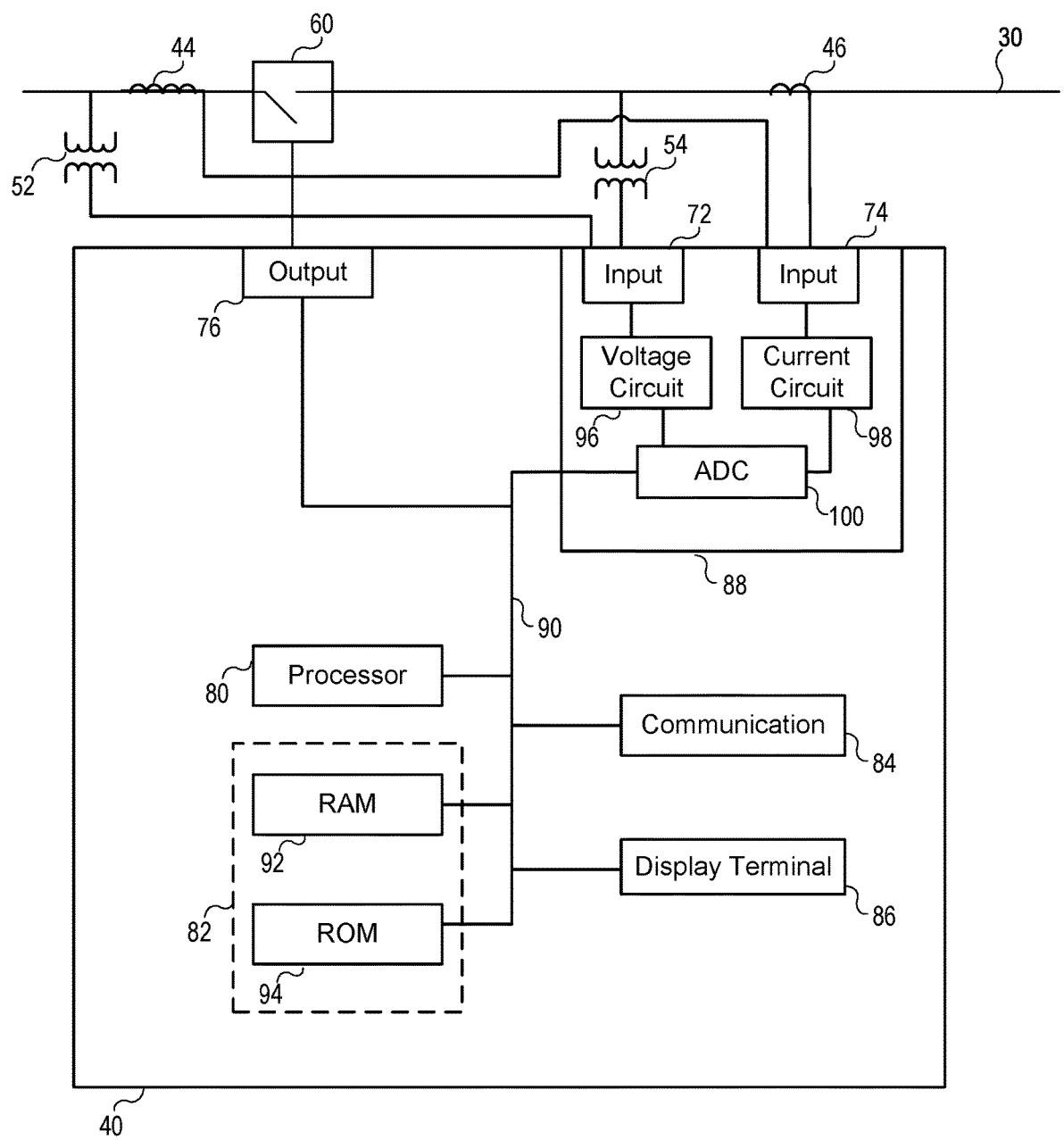
FIG. 2 is a block diagram of the IED of FIG. 1, in accordance with an embodiment.

FIG. 2 is a block diagram of the IED 40 that opens the CB 60 and estimates trapped charge on the power line. The IED 40 may be connected to CTs 44 and 46 and CVTs 52 and 54 via inputs 74 and 72 to allow the IED 40 to receive signals of electrical conditions (e.g., voltage and current). The IED 40 may be connected to the CB 60 via the output 76 to allow the IED 40 to send a signal to the CB 60 to open/close the CB 60. The inputs 72 and 74 and output 76 may refer to contacts, ports, connectors, pins, and the like, used to connect the IED 40 to other devices. The CB 60 may include a switching device that electrically connects or disconnects the power line to the remaining power system depending on the signals from the IED 40. While a single phase is shown in FIG. 2, note that the CB 60 may be connected to each phase of the power line 30. Further, each phase of the CB 60 may include an individual switching mechanism and device (i.e., single-pole switching) that allows each pole to be reclosed at times independent of the remaining poles of the switching device.

The IED 40 may further include one or more processors 80, a computer-readable medium (e.g., memory 82), a communication interface 84, a display terminal 86, and detection circuitry 88 communicatively coupled to each other via one or more communication buses 90 The processor 80 may be embodied as a microprocessor, a general-purpose integrated circuit, an application specific integrated circuit (ASIC), a field programmable gate array (FPGA), and/or other programmable logic devices. It should be noted that the processor 80 and other related items in FIG. 2 (e.g., the memory 82) may be generally referred to herein as "processing circuitry." Furthermore, the processing circuitry may be a single contained processing module or may be incorporated wholly or partially within any of the other elements within the IED 40. It should be noted that FIG. 2 is merely one example of a particular implementation and is intended to illustrate the types of components that may be present in the IED 40.

In the IED 40 of FIG. 2, the processor 80 may be operably coupled with the memory 82 to perform various algorithms. Such programs or instructions executed by the processor 80 may be stored in any suitable article of manufacture that includes one or more tangible, computer-readable media at least collectively storing the instructions or routines, such as the random-access memory (RAM 92) and the read-only memory (ROM 94).

In the illustrated embodiment, the IED 40 includes detection circuitry 88 that detects various electrical conditions of the power line based on the input signals. The detection circuitry 88 may include a voltage conversion circuit 96 (e.g., transformer) and a current conversion circuit 98 (e.g., transformer) that transform the input signals to levels that may be sampled by the IED 40. The detection circuitry 88 may include analog-to-digital converter(s) 100 that sample the current and voltage signals and produce digital signals representative of measured current and measured voltage on the power line, which may be transmitted to the processor 80. The IED 40 may compare the current and/or voltage to thresholds to detect faults and to disconnect the power line 30 from the power source 22. For example, if current exceeds a preset threshold and/or current-over-time exceeds a preset threshold, the processor 80 may detect a fault event on the power line 30 and send a signal to open the CB 60.

The communication interface 84 may include a fiber optic transceiver that communicates with another IED, such as the remote IED 42, to receive signals indicating one or more measurements from the other IED While the illustrated embodiment communicates with the remote IED 42, in other embodiments, the IED 42 may communicate with many devices or may operate as an independent device without communication. In some embodiments, the IED 40 may include a display terminal 86 to allow operators to review events on the power line 30, change settings, etc.

The IED 40 may detect a fault event on the power line 30. As mentioned above, some faults are transient faults that may be cleared by opening the CB 60 and waiting for a period of time. To allow the temporary fault to clear, the IED 40 may open the CB 60 and subsequently attempt to reclose the CB 60 after a period of time to allow the power line 30 to continue to provide power to loads.

Due to the trapped charge on the power line 30, there may be a voltage difference between the power line 30 and the power being provided by the power source 22, which may cause voltage transients (e.g., traveling waves). Depending on the line characteristics, the voltage transients may exceed the expected designed ratings, such as basic insulation level, of the power line 30. In some cases, the voltage transients may cause what would otherwise be a transient fault to become a persistent fault that remains on the power line 30 due to exceeding the designed ratings of the power line.

As explained below, the amount of trapped charge may be estimated by the IED 40 using the voltage measurements received from the CVT 54. The trapped charge may then be used to obtain a closing point-on-wave (POW) at which to close the CB 60 during the reclose process to match the voltage of the remaining power system with the voltage from the trapped charge. Further, using the process described below, the IED 40 may be commissioned without user settings related to trapped charge.

Figure 3:
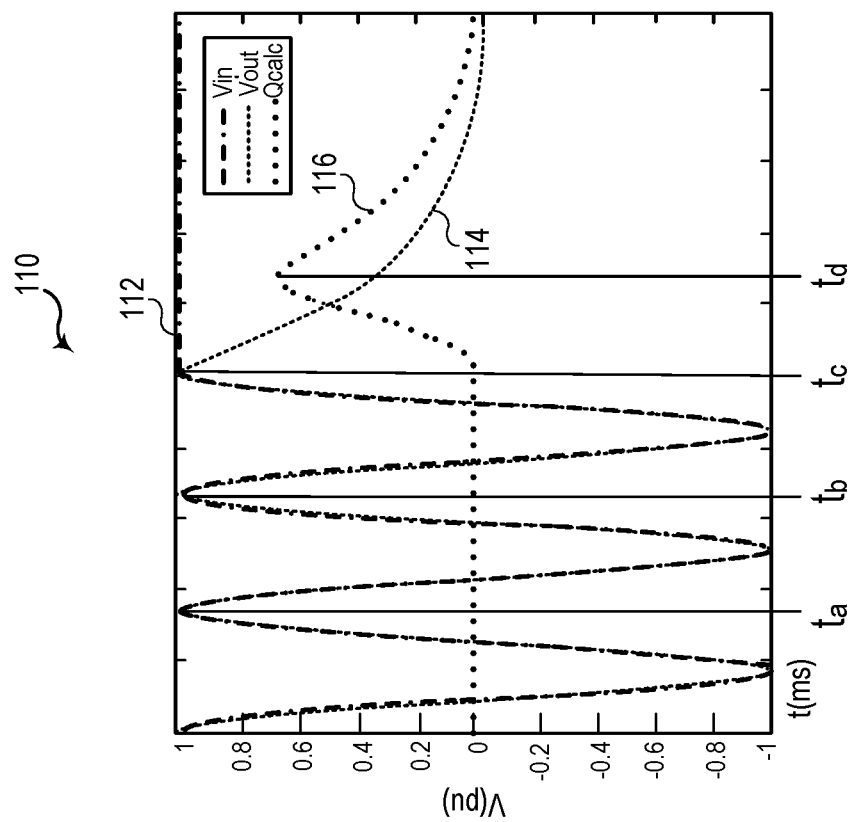
FIG. 3 is a plot of voltage and trapped charge obtained by the IED of FIG. 1, in accordance with an embodiment.

FIG. 3 is a plot 110 of the actual voltage signal 112 of the power line 30, the measured voltage signal 114 from the CVT 54, and the estimated trapped charge signal 116 of the power line 30. At time $t_c$, the power line 30 is disconnected from the power source 22 by opening the CB 60. The trapped charge signal 116 represents potential trapped charge ($Q_{calc}$) values that are calculated by summing the voltages over a cycle. That is, the IED 40 may sum samples of the voltage signal 114 repeatedly over a cycle from the present time to obtain the $Q_{calc}$ signal 116. For example, integrating the voltage signal 114 over a cycle from $t_a$ to $t_b$ results in the $Q_{calc}$ signal 116 at ti, which is zero. At time $t_c$, the sum of the voltages may begin to increase as the voltage signal 114 from the CVT 54 stops oscillating due to opening the CB 60. The summation of the voltages may reach a peak at time td. As explained below, the IED 40 may determine the trapped charge on the power line 30 as being the maximum of the potential trapped charge values of the $Q_{calc}$ signal 116.

Figure 4:
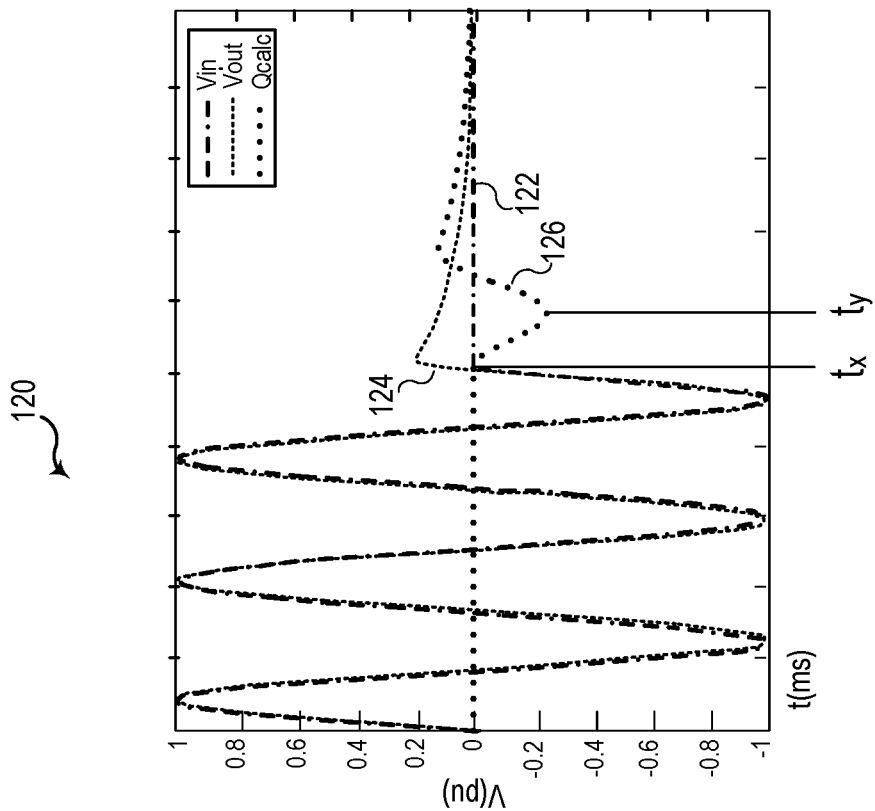
FIG. 4 is another plot of voltage and trapped charge obtained by the IED of FIG. 1, in accordance with an embodiment.

FIG. 4 is another plot 120 of the actual voltage signal 122 of the power line 30, the measured voltage signal 124 detected via the CVT 54, and the trapped charge signal 126 from the IED 40 in an example in which the CB 60 is opened at zero volts per-unit at time $t_x$. By summing the voltages, a maximum amplitude of the trapped charge calculation may be obtained at time $t_y$ (shown as −0.24).

Figure 5:
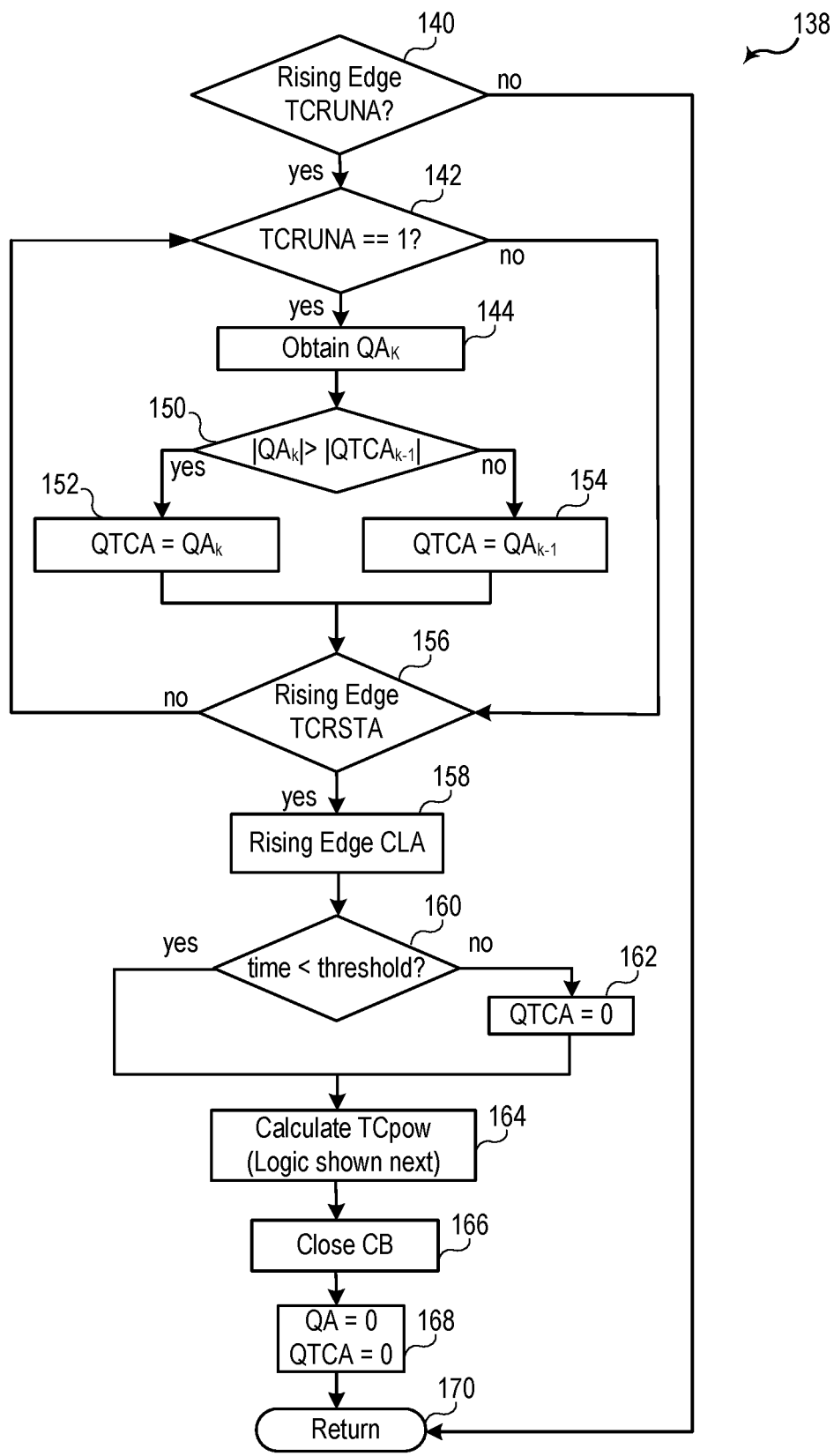
FIG. 5 is a flow chart of a process performed by the IED of FIG. 1 to estimate the trapped charge and close a circuit breaker at a time based on the estimated trapped charge, in accordance with an embodiment.

FIG. 5 is a flow diagram of a process 138 that may be performed by the IED 40 to determine the amount of trapped charge on the A-phase of the power line 30 and to close the CB 60 at a time that reduces or minimizes transients caused by differences in the remaining online power system voltage and the disconnected power line voltage due to trapped charge. The process 138 may be performed by the processor 80 by executing instructions (e.g., code) stored in the memory 82.

The process 138 begins with detection that the CB 60 has opened. For example, the CB 60 may be opened to prevent overcurrents, overvoltages, or other events on the power line 30. Upon the opening signal sent to CB 60, the processor 80 may detect a rising edge of a trapped charge algorithm assertion (diamond 140). The rising edge of a trapped charge run algorithm assertion of the A-phase (TCRUNA) may refer to a signal that is asserted when the power line 30 is energized (e.g., in steady state) and the CB 60 is subsequently tripped. Upon assertion in which TCRUNA is true (diamond 142), the processor 80 may calculate potential trapped charge values of the A-phase based on the voltage measurements from the CVT 54 using the process described with respect to FIG. 6.

Figure 6:
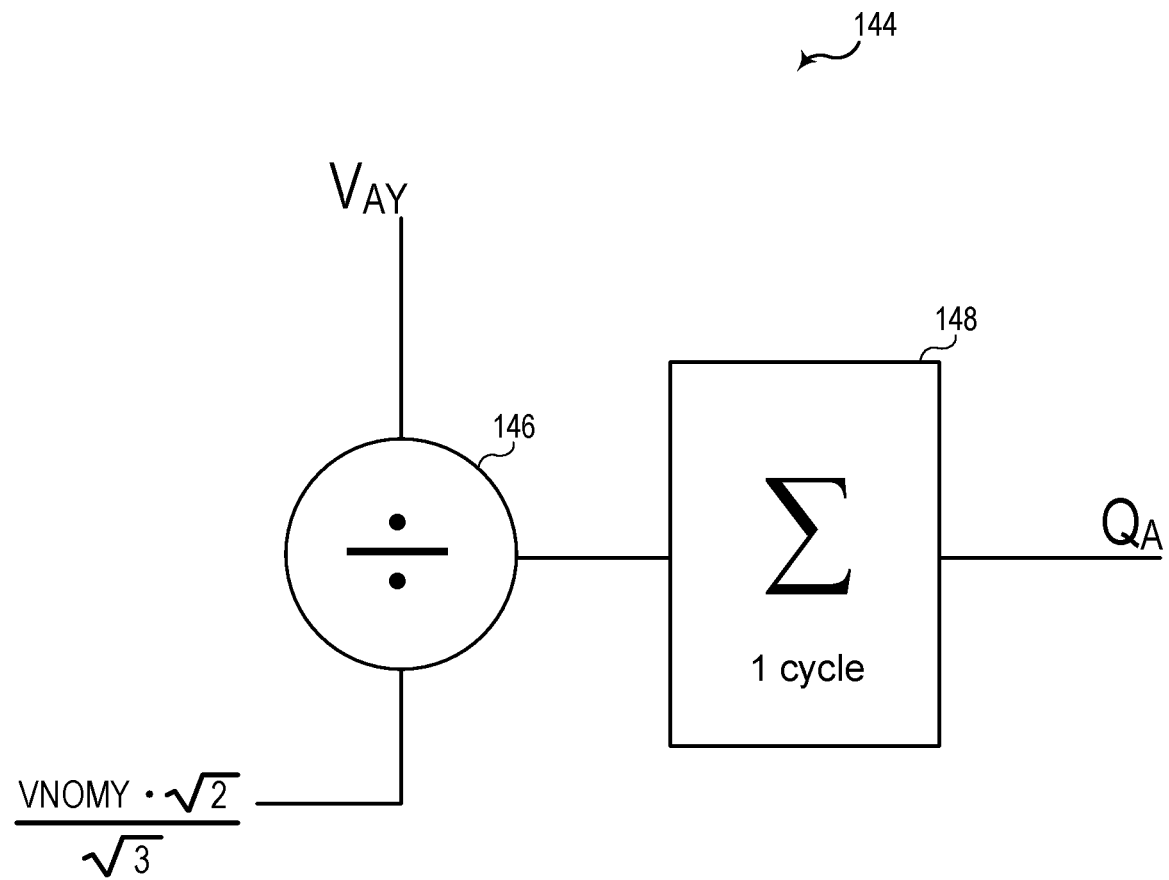
FIG. 6 is a flow diagram performed by the IED of FIG. 1 to estimate the charge on the power line, in accordance with an embodiment.

FIG. 6 is a diagram of a technique that may be used to estimate a potential trapped charge value of the A-phase of the power line 30 (block 144). While the process is described with respect to the A-phase of a three-phase system, a similar process may be performed on the B-phase and C-phase. As illustrated, the A-phase voltage (VAY) may be divided, at divider 146, by the nominal voltage (VNOMY) and a factor to obtain a per-unit voltage. The calculations may be summed at summation 148 over a cycle to determine the A-phase charge (QA) at time k.

Returning to FIG. 5, the processor 80 may then compare the magnitude of the calculated $QA_K$ with the magnitude of a maximum value of trapped charge (QTCA) (diamond 150). If the calculated $QA_K$ exceeds the maximum value of the trapped charge, the maximum value of trapped charge may be updated to be $QA_K$ (block 152). If the calculated $QA_K$ falls below QTCA, the previous QTCA value may be maintained (block 154). This process may be repeated until a reset signal (TCRSTA) is detected (diamond 156). For example, the trapped charge process of steps 142-156 may be run for a preset number of cycles (e.g., 12 cycles), at which point TCRSTA is set to be asserted. By repeating steps 142-156 repeatedly over time, the processor 80 may obtain an overall maximum value of trapped charge when the CB 60 is tripped. That is, the processor 80 may select the maximum trapped charge value from each of the calculated potential trapped charge values (i.e., summed voltages over a cycle) to be used as the estimated trapped charge of the A-phase. The estimation process of steps 142-156 may be repeated for each of the remaining phases of the power system.

The processor 80 may detect a rising edge CLA signal indicating that the IED 40 may close the CB 60 (block 158). For example, a predetermined time (e.g., 12 cycles) may pass prior to receiving the rising edge CLA signal asserting that sufficient time for transient faults to clear has passed. Depending on the amount of time that passes (diamond 160), QTCA may be reset to zero (block 162). That is, if enough time passes (e.g., 10 seconds), the trapped charge on the power line 30 may be asserted as being zero. Upon determining the estimated trapped charge of each of the phases, the IED 40 may determine a closing point-on-wave (POW) to close each of the poles of the CB 60 using the TCpow process (block 164). The process of determining the trapped charge POW is described with respect to FIGS. 7 and 8.

Figure 7:
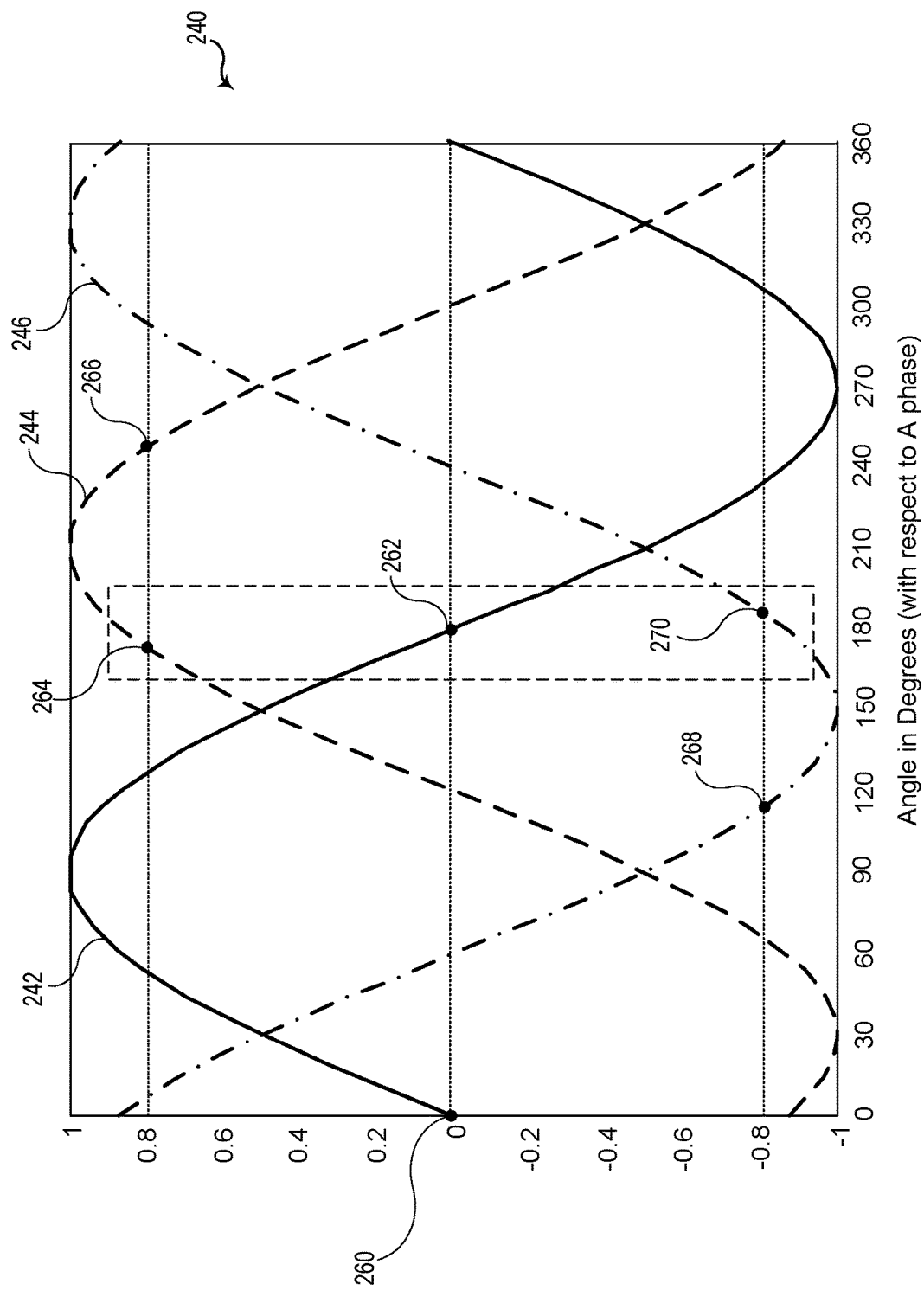
FIG. 7 is a plot of points-on-wave of the estimated trapped charge of each phase that indicate times at which the IED of FIG. 1 may close the circuit breaker, in accordance with an embodiment.
Figure 8:
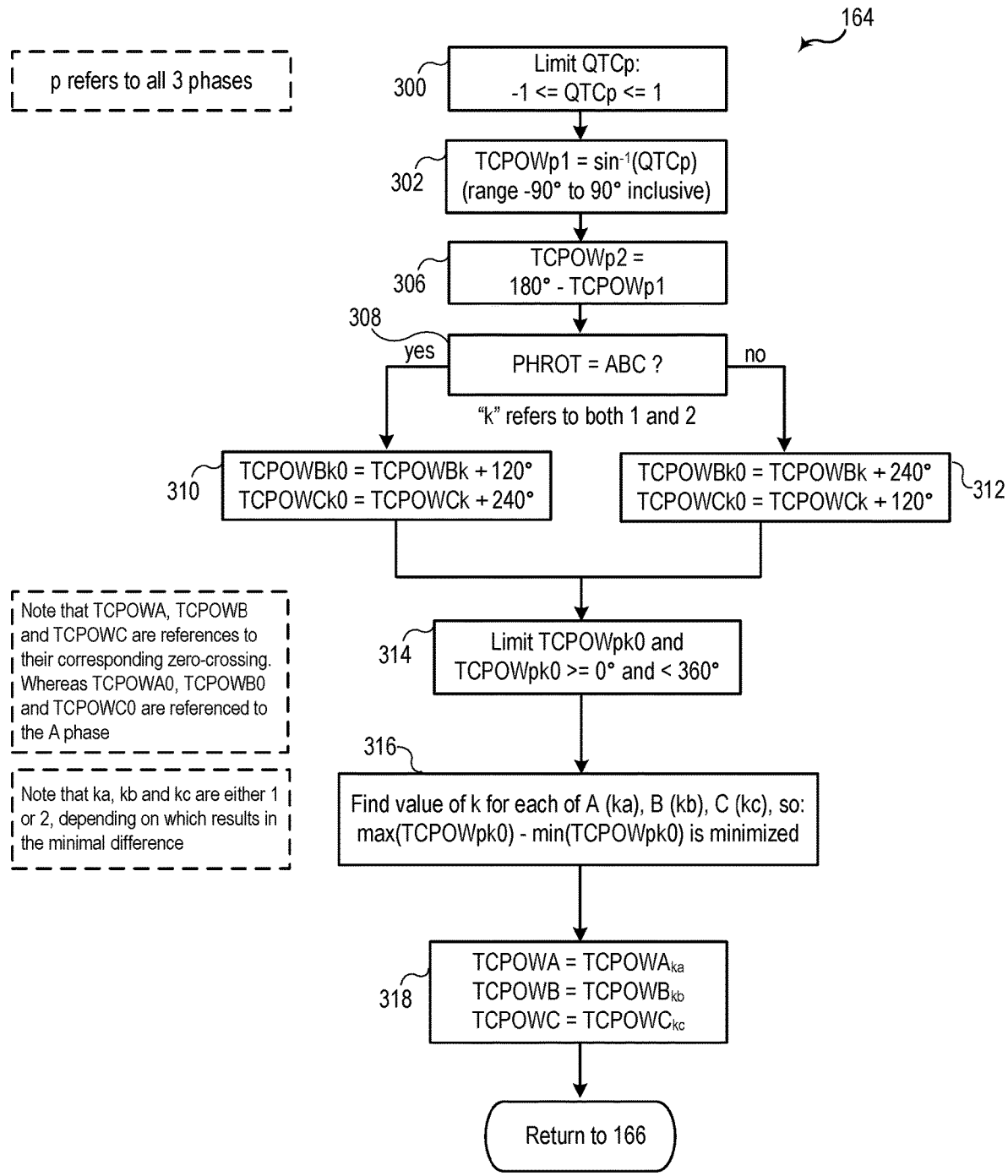
FIG. 8 is a flow chart of a process performed by the IED to determine the points-on-wave to close each pole of the circuit breaker to reduce or minimize the closing time of the circuit breaker while reducing transients caused by differences between the voltages of the power system and the voltages from the trapped charge of the power line, in accordance with an embodiment.

FIG. 7 is an example plot 240 of the A-phase 242, B-phase 244, and C-phase 246 of a power system to illustrate the process described in FIG. 8 to determine trapped charge point-on-wave (TCpow) times for closing the poles of the CB 60. During the reclosing process, the IED 40 may close the poles of the CB 60 using the TCpow times that reduce or minimize voltage transients caused by the trapped charge on the power line 30. In the illustrated example, from the process described in steps 142-156, the trapped charge of the A-phase is zero, B-phase is 0.8, and C-phase is −0.8.

As described in FIG. 8, the process 164 may begin by limiting the estimated trapped charge of each phase (QTCp) as being between −1 and 1 (block 300). A first trapped charge point-on-wave value (TCPOWp1) may be determined as the arcsine of QTCp. For example, the processor 80 may calculate the arcsine of [0 0.8 −0.8] as being approximately [0 53.11 −53.11] degrees to obtain TCPOWp1 (block 302). The processor 80 may calculate a second trapped charge point-on-wave value (TCPOWp2) as being 180 degrees minus TCPOWp1 (block 306). The processor 80 may perform similar calculations for the trapped charge point-on-wave 264 and 266 of the B-phase 244 and trapped charge point-on-wave 268 and 270 of the C-phase 246.

Closing the CB 60 of one phase begins to affect the trapped charge of the remaining unclosed poles. By limiting the total amount of time from closing of the first phase to closing of the last phase, the open pole duration and the coupling effect between the phases may be minimized. The B phase and the C phase POW times may be adjusted to be aligned in time with the A phase to determine the minimum close time for the phases based on the first and second trapped charge point-on-wave values (blocks 308-314).

The processor 80 may use the system phase rotation (PHROT) for the relationship between the phases (block 308). Depending on the order of the phases, the B-phase and the C-phase may be adjusted with a different angle to align the time of the A-phase with the B-phase and C-phase (blocks 310 and 312). As illustrated in FIG. 7, the B-phase lags 120 degrees relative to the A-phase and the C phase lags 240 degrees relative to the A phase, indicating an ABC relationship. By adding degrees to the corresponding trapped charge point-on-wave, each potential closing time is referenced to the A-phase. The trapped charge point-on-wave of each phase may be limited to being between 0 degrees and 360 degrees (e.g., by moving points outside the window by 360 degrees) (block 314), as illustrated by the window of the graph 240.

The processor 80 may then select the value of k for each of the A phase, B phase, and C phase, such that time difference between the closing of the first pole and the closing of the last pole is minimized (block 316). With respect to FIG. 7, from the set of potential point-on-wave close time values including points 260, 262, 264, 266, 268, and 270, the processor 80 may select the minimized time difference between a maximum point-on-wave and a minimum point-on-wave as being between points 262, 264, and 270. By minimizing total amount of time from closing of the first pole to closing of the last pole, the IED 40 may reduce the impact that the first pole closing has on the coupling and consequently charging of the remaining two poles. The processor 80 may then set the close times of each phase using the selected values (e.g., point-on-wave 262, 264, and 270) (block 318).

Returning to FIG. 5, the processor 80 may send signals to the switches of the CB 60 to close the individual poles of the power line 30 at the TCPOW close times (block 166). For example, the processor 80 may send a signal to an individual pole switch of the B-phase of the CB 60 to close the B-phase when the voltage angle measured by the CVT 52 matches the TCPOWB point 264. The processor 80 may then send a signal to an individual pole switch of the A-phase of the CB to close the A-phase when the voltage angle measured by the CVT 52 of the remaining power system matches the TCPOWA 262. This process may then be repeated for the C-phase at TCPOWC 270. By closing the CB 60 at the TCPOW times, transient voltages caused by voltage differences between the power system 20 and the disconnected power line 30 may be reduced or minimized. Further, the time delay between closing each of the phases may be minimized to prevent trapped charge on the first phase closed from affecting the trapped charge of the remaining phases. QA and QTCA may be reset to zero for the next occurrence of a fault (block 168). The process may then return to wait for the next assertion of the TCRUNA signal (block 170).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An intelligent electronic device (IED) of a power system, comprising:
   a capacitive voltage transformer (CVT);
   memory; and
   a processor operatively coupled to the memory, wherein the processor is configured to execute instructions stored on the memory to cause the processor to:
   calculate an analog amount of trapped charge of each phase of a power line based on voltage measurements of the power line;
   determine an arcsin of the analog amount of trapped charge to obtain a point-on-wave at which to close a switching device; and
   close the switching device of each phase at a time corresponding to the point-on-wave associated with the arcsine of the analog amount of trapped charge of the respective phase.

2. The IED of claim 1, wherein the processor is configured to:
   obtain a sum using a one-cycle rolling, moving window of voltage measurements on the power line as a trapped charge amount over the cycle.

3. The IED of claim 2, wherein the processor is configured to select a maximum of the rolling trapped charge amounts as the analog amount of trapped charge on the power line.

4. The IED of claim 1, wherein the processor is configured to calculate the time to close the switching device of each phase to match a voltage of the power system that is online with a voltage from the trapped charge of the power line to reduce or minimize the voltage difference between the power line and the power system, thereby minimizing traveling waves launched during closing.

5. The IED of claim 1, wherein the processor is configured to initiate closing at the time without receiving inputs of any trapped charge user settings.

6. The IED of claim 1, wherein the processor is configured to:
   calculate the point-on-wave of each phase of the power line; and
   calculate a time to close the switching device of each phase that minimizes the time difference between a first phase closing time and a last phase closing time to limit the amount of change to the trapped charge caused by closing of the first phase.

7. The IED of claim 6, wherein the processor is configured to:
   determine a first set of points of each phase and a second set of points of each phase that match the analog amount of trapped charge associated with each phase;
   selecting closing times from the first and second set of points of each phase closest in time to each other.

8. The IED of claim 6, wherein the processor is configured to:
   determine each point in the first set of points as being the arcsin of the analog amount of trapped charge; and
   determine each point of the second set of points as being 180 degrees minus the first point of the respective phase from the first set of points.

9. A non-transitory, computer readable medium, comprising instructions configured to be executed by a processor to cause the processor to:
   calculate an analog amount of trapped charge of a power line based on voltage measurements of the power line;
   determine an arcsin of the analog amount of trapped charge to obtain a point-on-wave at which to close a switching device; and
   close the switching device of each phase of the power line at a time corresponding to the point-on-wave associated with the arcsin of the analog amount of trapped charge of the respective phase.

10. The non-transitory, computer-readable medium of claim 9, wherein the instructions are configured to be executed by the processor to cause the processor to:
    determine a per-unit voltage from the voltage measurements; and
    integrate the per-unit voltage over a cycle to obtain the analog amount of trapped charge.

11. The non-transitory, computer-readable medium of claim 9, wherein the instructions are configured to be executed by the processor to cause the processor to calculate a second potential point-on-wave as being 180 degrees minus the first potential point-on-wave.

12. The non-transitory, computer-readable medium of claim 9, wherein the instructions are configured to be executed by the processor to cause the processor to align a B-phase point-on-wave and a C-phase point-on-wave according to A-phase point-on-wave.

13. The non-transitory, computer-readable medium of claim 9, wherein the instructions are configured to be executed by the processor to cause the processor set the analog amount of trapped charge to zero when the time to close the switching device exceeds a threshold amount of time.

14. A method, comprising:
  determining a per-unit voltage of each phase of a power line from voltage measurements of the power line;
  determining a normalized trapped charge amount from the per-unit voltages of each phase;
  determining an arcsin of the normalized trapped charge amount;
  determining a point-on-wave of each phase that corresponds to the arcsin of the normalized trapped charge amount; and
  closing a switching device of each phase of the power line at a time corresponding to the point-on-wave of the respective phase.

15. The method of claim 14, comprising:
  normalizing the trapped charge amount to be −1 per unit, 1 per unit, or any per-unit value therebetween; and
  clamping any analog trapped charge amounts with a magnitude greater than 1.

16. The method of claim 14, comprising
  obtain per-unit voltages from the voltage measurements; and
  sum the per-unit voltages over the preceding cycle to obtain an analog amount of trapped charge.

17. The method of claim 14, comprising initiating closing at the time without receiving inputs of any trapped charge user settings during commissioning.

18. The method of claim 14, comprising calculating a time to close the switching device of each phase that minimizes the time difference between a first phase closing time and a last phase closing time to limit the amount of change to the trapped charge caused by closing of the first phase.

19. The method of claim 18, comprising sending signals to each individual switching device at the corresponding calculated time.

* * * * *